United States Patent
Jeong

(10) Patent No.: US 7,999,282 B2
(45) Date of Patent: Aug. 16, 2011

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 106 days.

(21) Appl. No.: 12/606,580

(22) Filed: Oct. 27, 2009

(65) Prior Publication Data

US 2010/0102355 A1    Apr. 29, 2010

(30) Foreign Application Priority Data

Oct. 27, 2008 (KR) .................. 10-2008-0105257

(51) Int. Cl.
*H01L 33/00* (2010.01)
(52) U.S. Cl. .................. 257/99; 257/E33.062
(58) Field of Classification Search .......... 257/99, 257/E33.062
See application file for complete search history.

(56) References Cited

U.S. PATENT DOCUMENTS

| | | | |
|---|---|---|---|
| 5,977,565 | A | 11/1999 | Ishikawa et al. |
| 2004/0245540 | A1 | 12/2004 | Hata et al. |
| 2006/0157718 | A1 | 7/2006 | Seo et al. |
| 2008/0128721 | A1 | 6/2008 | Watanabe et al. |
| 2010/0019264 | A1* | 1/2010 | Jeong ................... 257/98 |
| 2010/0124797 | A1 | 5/2010 | Lee |

FOREIGN PATENT DOCUMENTS

| | | |
|---|---|---|
| JP | 55-86180 A | 6/1980 |
| JP | 10-135519 A | 5/1998 |
| JP | 2004-342885 A | 12/2004 |
| JP | 2006-108633 A | 4/2006 |
| JP | 2007-251221 A | 9/2007 |
| KR | 10-2002-0026619 A | 4/2002 |
| KR | 10-0495004 B1 | 1/2004 |
| KR | 10-2006-0035424 A | 4/2006 |
| KR | 10-0649642 B1 | 11/2006 |
| KR | 10-2007-0076895 A | 7/2007 |
| KR | 10-2008-0035472 A | 4/2008 |
| KR | 10-2008-0082101 A | 9/2008 |
| WO | WO 2005/091388 A1 | 9/2005 |
| WO | WO 2009/084860 A2 | 7/2009 |

OTHER PUBLICATIONS

Chuang et al., Solid-State Electronics, vol. 52, pp. 1043-1046 (2008), Apr. 2008.

* cited by examiner

*Primary Examiner* — Mark Prenty
(74) *Attorney, Agent, or Firm* — Birch, Stewart, Kolasch & Birch, LLP

(57) ABSTRACT

Embodiments relate to a semiconductor light emitting device. The semiconductor light emitting device according to embodiments comprises a light emitting structure comprising a plurality of compound semiconductor layers; a first electrode under the light emitting structure; a second electrode layer on the light emitting structure; a first insulating layer between the light emitting structure and the second electrode layer; and a metal layer formed under the first insulating layer and electrically connected to the first electrode.

14 Claims, 6 Drawing Sheets

US 7,999,282 B2

SEMICONDUCTOR LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2008-0105257 (filed on Oct. 27, 2008), which is hereby incorporated by reference in its entirety.

BACKGROUND

The present disclosure relates to a semiconductor light emitting device.

Group III-V nitride semiconductors have been in the spotlight as a core material for light emitting devices, such as light emitting diodes (LEDs), laser diodes (LDs), and the like, due to excellent physical and chemical properties thereof. The III-V nitride semiconductor includes a semiconductor material having the formula $In_xAl_yGa_{1-x-y}N$ (where 0.x.1, 0.y.1, 0.x+y.1).

A Light Emitting Diode (LED) is a kind of semiconductor device that converts electricity into infrared rays or light using the characteristics of a compound semiconductor to transmit and receive a signal, or is used as a light source.

The LEDs or Laser diodes (LDs) made of these nitride semiconductor materials are extensively adopted in light emitting devices for obtaining light, and are applied as a light source for various products such as a keypad light emitting diode of a mobile phone, an electrical sign board, and a lighting device.

SUMMARY

Embodiments provide a semiconductor light emitting device with a capacitor structure.

Embodiments provide a semiconductor light emitting device to improve ESD (electro-static discharge) characteristics by disposing an insulating layer between a metal layer and a second electrode layer to embody a capacitor.

An embodiment provides a semiconductor light emitting device comprising: a light emitting structure comprising a plurality of compound semiconductor layers; a first electrode under the light emitting structure; a second electrode layer on the light emitting structure; a first insulating layer between the light emitting structure and the second electrode layer; and a metal layer formed under the first insulating layer and electrically connected to the first electrode.

An embodiment provides a semiconductor light emitting device comprising: a light emitting structure comprising a first conductive semiconductor layer, an active layer on the first conductive semiconductor layer, and a second conductive semiconductor layer on the active layer; a first electrode under the first conductive semiconductor layer; a second electrode layer on the second conductive semiconductor layer; a second insulating layer on an outer side of the light emitting structure; a first insulating layer under the second electrode layer; and a metal layer comprising a loop pattern under a circumference of the first insulating layer and a connection pattern electrically connected to the first electrode on the second insulating layer.

An embodiment provides a semiconductor light emitting device comprising: a first conductive semiconductor layer; an active layer on the first conductive semiconductor layer; a second conductive semiconductor layer on the active layer; a first electrode under the first conductive semiconductor layer; a second electrode layer on the second conductive semiconductor layer; a first insulating layer between the second conductive semiconductor layer and the second electrode layer; and a metal layer formed under the first insulating layer and electrically connected to the first electrode, wherein the first insulating layer comprises a protrusion disposed in a closed loop shape on a certain regions from the second conductive semiconductor layer to the upper portion of the first conductive semiconductor layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'.

Figure 1:
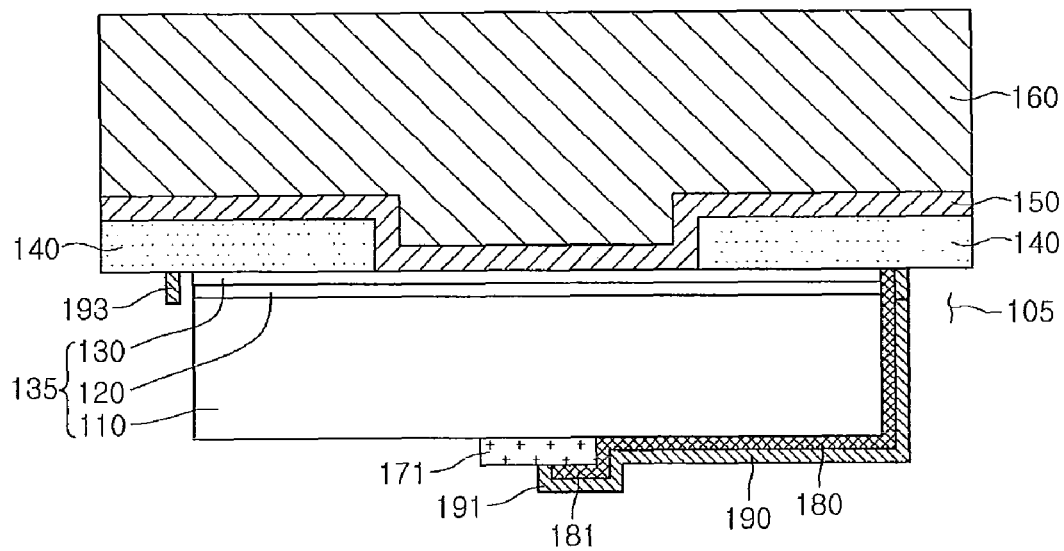
FIG. 1 is a side-sectional view of a semiconductor light emitting device according to a first embodiment.
Figure 2:
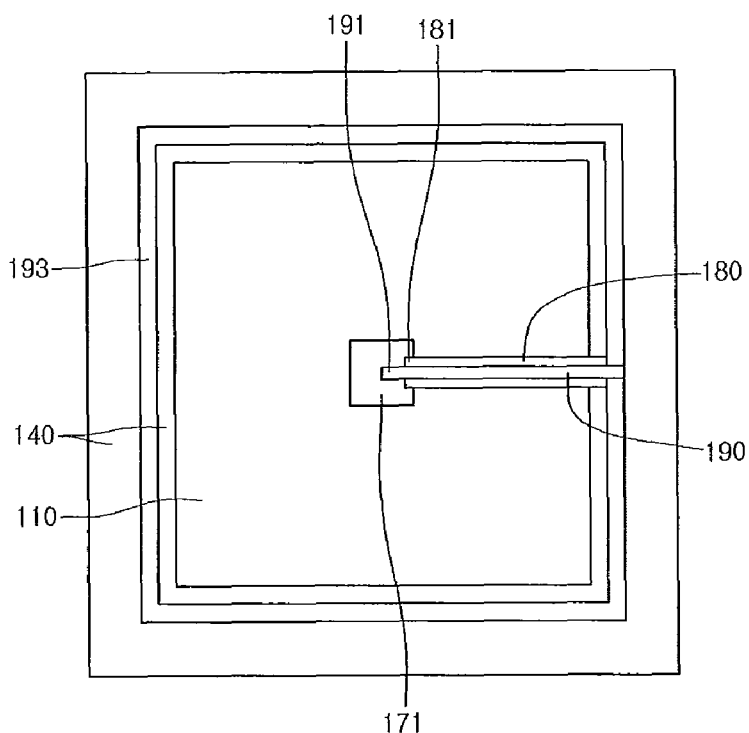
FIG. 2 is a plan view of FIG. 1.
Figure 3:
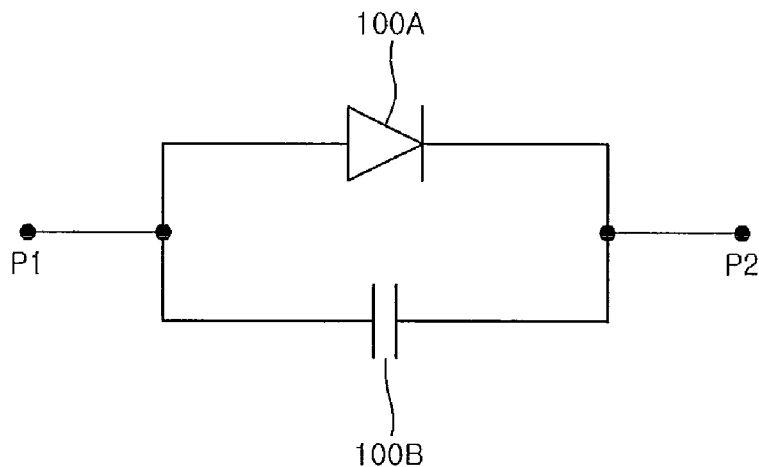
FIG. 3 is a circuit diagram illustrating an equivalent circuit of FIG. 1.

FIG. 1 is a side-sectional view of a semiconductor light emitting device according to a first embodiment, FIG. 2 is a plan view of FIG. 1, and FIG. 3 is a circuit diagram illustrating an equivalent circuit of FIG. 1.

Referring to FIGS. 1 and 2, a semiconductor light emitting device 100 includes a light emitting structure 135, a first insulating layer 140, a second electrode layer 150, a conductive supporting member 160, a second insulating layer 180, and a metal layer 190.

The light emitting structure 135 includes an LED using a plurality of compound semiconductor layers, for example, group III-V compound semiconductors, and the LED may be a colored LED or a UV LED which emits blue light, green light, or red light. Light emitted by the LED may be diversely implemented within the technical scope of embodiments. The compound semiconductor may have, but is not limited to, a formula of $In_xAl_yGa_{1-x-y}N$ (where 0.x.1, 0.y.1, 0.x+y.1).

The light emitting structure 135 includes a first conductive semiconductor layer 110, an active layer 120, and a second conductive semiconductor layer 130.

The first conductive semiconductor layer 110 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case where the first conductive semiconductor layer 110 is an N-type semiconductor, the first conductive dopant includes an N-type dopant such as si, Ge, Sn, Se, and Te. The first conductive semiconductor layer 110 may be formed in a mono- or multi-layer, but is not limited thereto.

A first electrode 171 is formed under the first conductive semiconductor layer 110, and the first electrode 171 may be formed in a predetermined pattern with a predetermined shape, but is not limited thereto. The first electrode 171 may include a bonding pad.

The first electrode 171 may be formed using a material selected from the group consisting of, but is not limited to, Ti, Al, In, Ta, Pd, Co, Ni, Si, Ge, Ag, and Au.

The active layer 120 is formed on the first conductive semiconductor layer 110, and may be formed in a single quantum well structure or a multiple quantum well structure. The active layer 120 may be periodically formed by the structure of a well layer and a barrier layer, for example, an InGaN well layer/GaN barrier layer by using the compound semiconductor material of group III-V elements. A conductive clad layer may be formed on and/or under the active layer 120, and the conductive clad layer may be formed of an AlGaN-based semiconductor.

The second conductive semiconductor layer 130 is formed on the active layer 120, and may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case where the second conductive semiconductor layer 130 is a P-type semiconductor, the second conductive dopant includes a P-type dopant such as Mg and Zn. The second conductive semiconductor layer 130 may be formed in a mono- or multi-layer, but is not limited thereto.

The first conductive semiconductor layer 110, the active layer 120, and the second conductive semiconductor layer 130 may be defined as a light emitting structure 135.

An N-type semiconductor layer or a P-type semiconductor layer may be also provided on the second conductive layer 120. In addition, the first conductive semiconductor layer 110 may include a P-type semiconductor layer, while the second conductive semiconductor layer 130 may include an N-type semiconductor layer. Accordingly, the light emitting structure 135 may include at least one selected from the group consisting of an N-P junction, a P-N junction, an N-P-N junction, and a P-N-P junction.

The first insulating layer 140 is formed on the top circumference of the second conductive semiconductor layer 130. The first insulating layer 140 may be formed in a continuous pattern with a belt shape, a loop shape, and a frame shape on the circumference region of the second conductive semiconductor layer 130.

The first insulating layer 140 may be formed of a transparent insulating material, which may include $SiO_2$, $SiO_x$, $SiO_xN_y$, or $Si_3N_4$.

The first insulating layer 140 may improve adhesive force with a material for the second conductive semiconductor layer 130. The first insulating layer 140 may be formed with a width or thickness of 2 μm or less, but is not limited thereto.

The outer side of the first insulating layer 140 is exposed to the outer circumference 105 of the first conductive semiconductor layer 110, the active layer 120, and the second conductive semiconductor layer 130. Accordingly, the first insulating layer 140 may separate the second electrode layer 150 from the second conductive semiconductor layer 130.

A laser irradiated during the manufacturing process is transmitted through the first insulating layer 140 to solve the side delamination of the light emitting structure 135. The first insulating layer 140 may also prevent metal debris generated by the second electrode layer 150 or the conductive supporting member 160 from being introduced into the outer side of the semiconductor layer 110, 120, and 130. In addition, the first insulating layer 140 may inhibit moisture from being penetrated into the outer side of the semiconductor layer 110, 120, and 130.

A second electrode layer may be formed on the first insulating layer 140 and the second conductive semiconductor layer 130. The second electrode layer may include the second electrode layer 150 and the conductive supporting member 160.

The second electrode layer 150 is formed at the outer side of the top of the second conductive semiconductor layer 130, which may be comprised at least one of an ohmic contact layer, a reflective layer, a adhesive layer and a seed metal.

The ohmic contact layer may be formed in the form of a layer or a plurality of patterns. The ohmic contact layer may be comprised at least one of a metal material and an oxide material. The ohmic contact layer may comprise at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh and Pd. The ohmic contact layer may have a thickness of about 10 Å to about 1 μm. However, the embodiment is not limited thereto. The reflective layer may be formed at least one of layers and formed of at least one of Ag, Ni, Al, Rh, Pd, Ir, Ru, Mg, Zn, Pt, Au and Hf, and materials consisting of the selective combination of these elements. The adhesive layer ma be formed at least one of layers and formed of at least one of Ti, Au, Sn, Ni, Cr, Ga, In, Bi, Cu, Ag, and Ta, and materials consisting of the selective combination of these elements. The second electrode layer 150 may be used as a seed layer for a plating process. The seed layer may be formed at least one of Ti, Cr, Ta, Cr/Au, Cr/Cu, Ti/Au, Ta/Cu, and Ta/Ti/Cu.

The conductive supporting member 160 may be formed on the second electrode layer 150. The conductive supporting member 160 may function as a base substrate, and its material may include copper (Cu), gold (Au), nickel (Ni), molybdenum (Mo), copper-tungsten (Cu—W), and carrier wafer such as Si, Ge, GaAs, ZnO, and SiC, SiGe, and GaN. The conductive supporting member 160 may be formed by an electroplating technique or in the form of a sheet, but is not limited thereto. The conductive supporting member 160 may be formed with a thickness of about 30 μm to about 150 μm, but is not limited thereto.

A second insulating layer 180 is formed at the outer side of the light emitting structure 135. The second insulating layer 180 is formed along the outer side of the first conductive semiconductor layer 110, the active layer 120, and the second conductive semiconductor layer 130, and one end 181 is disposed under some portions of the first electrode 171 and the other end is disposed under the first insulating layer 140.

Referring to FIGS. 1 and 2, the metal layer 190 includes a connection pattern 191 and a loop pattern 193. The connection pattern 191 is formed under the second insulating layer 180, one end is electrically connected to the first electrode 171, and the other end is electrically connected to the loop pattern 193.

The second insulating layer 180 is disposed between the connection pattern 191 of the metal layer 190 and the semiconductor layer 110, 120, and 130 to insulate them.

The metal layer 190 may be formed in a mono- or multi-layer of at least one selected from the group consisting of Ti, Al, In, Ta, Pd, co, Ni, Si, Ge, Ag, Au, and an alloy thereof.

The loop pattern 193 is electrically connected to the connection pattern 191 of the metal layer 190, and disposed along the bottom circumference of the first insulating layer 140. Accordingly, the loop pattern 193 of the metal layer 190 and the second electrode layer face each other on both sides of the first insulating layer 140.

A first current path passing through the light emitting structure 135 and a second current path corresponding to the first insulating layer 140 may be disposed in parallel.

Referring to FIG. 3, the first insulating layer 140 functions as a capacitor 100B between the loop pattern 193 of the metal layer 190 and the second electrode layer 150, and the capacitor 100B is parallel connected to both ends P1 and P2 of the light emitting device 100A.

The capacitor 100B may charge and discharge an ESD voltage applied to the light emitting structure 100 to protect the semiconductor layer 110, 120, and 130 of the light emitting structure 135. Accordingly, a device having characteristic which is robust against ESD may be provided by including a built-in capacitor 100B.

The capacitance of the capacitor 100B may be controlled to line width or thickness of the metal layer 190, and then may be controlled in consideration of electrical characteristics of the light emitting structure 135.

FIGS. 4 to 11 are diagrams illustrating a process of manufacturing the semiconductor light emitting device in FIG. 1

Figure 4:
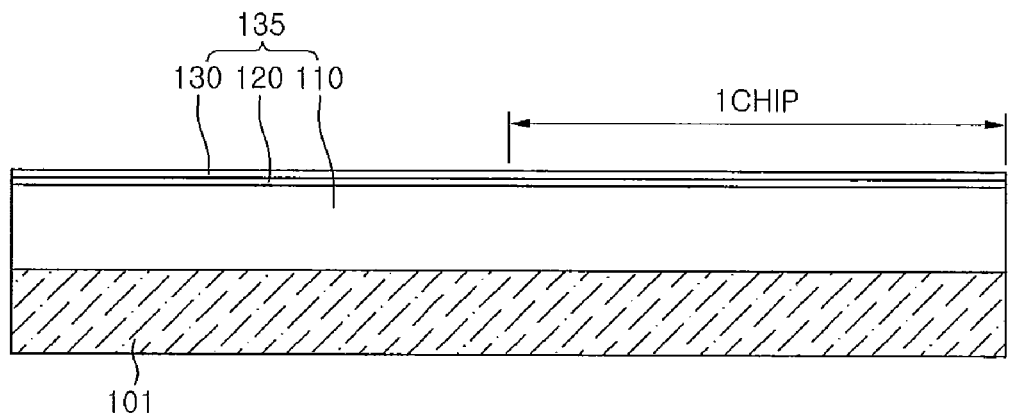
FIGS. 4 to 11 are diagrams illustrating a process of manufacturing the semiconductor light emitting device in FIG. 1.

Referring to FIG. 4, a substrate 100 is loaded into growth equipment, and a compound semiconductor layer of group II to group VI elements is formed thereon.

The growth equipment may include an electron beam evaporator, physical vapor deposition (PVD), chemical vapor deposition (CVD), plasma laser deposition (PLD), dual-type thermal evaporator, sputtering and metal organic chemical vapor deposition (MOCVD), but is not limited thereto.

The substrate 101 may be selected from the group consisting of sapphire substrate ($Al_2O_3$), GaN, SiC, ZnO, Si, GaP, InP, $Ga_2O_3$, conductive substrate, and GaAs. A concave-convex pattern may be formed on the top of the substrate 101. A layer or pattern using a compound semiconductor of group II to group VI elements, for example, at least one selected from the group consisting of ZnO layer (not shown), buffer layer (not shown), and undoped semiconductor layer (not shown) may be formed.

The buffer layer and the undoped semiconductor layer may be formed using a compound semiconductor of group III-V elements, the buffer layer may decrease a lattice constant difference with the substrate, and the undoped semiconductor layer may be formed of an undoped GaN-based semiconductor.

A light emitting structure 135 including a plurality of compound semiconductor layers may be formed on the substrate 101. The light emitting structure 135 includes a first conductive semiconductor layer 110, an active layer 120, and a second conductive semiconductor layer 130. The first conductive semiconductor layer 110 is formed on the substrate 101 or another semiconductor layer, the active layer 120 is formed on the first conductive semiconductor layer 110, and the second conductive semiconductor layer 130 is formed on the active layer 120.

The first conductive semiconductor layer 110 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case where the first conductive semiconductor layer 110 is an N-type semiconductor, the first conductive dopant includes an N-type dopant such as si, Ge, Sn, Se, and Te. The first conductive semiconductor layer 110 may be formed in a mono- or multi-layer, but is not limited thereto.

An active layer 120 is formed on the first conductive semiconductor layer 110, and the active layer 120 may be formed in a single quantum well structure or a multiple quantum well structure. The active layer 120 may be periodically formed by a well layer and a barrier layer, for example, an InGaN well layer/GaN barrier layer by using the compound semiconductor material of group III-V elements.

A conductive clad layer may be formed on and/or under the active layer 120, and the conductive clad layer may be formed of an AlGaN-based semiconductor.

The second conductive semiconductor layer 130 is formed on the active layer 120, and the second conductive semiconductor layer 130 may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case where the second conductive semiconductor layer 130 is a P-type semiconductor, the second conductive dopant includes a P-type dopant such as Mg and Zn. The second conductive semiconductor layer 130 may be formed in a mono- or multi-layer, but is not limited thereto.

In addition, a third conductive semiconductor layer, for example, an N-type semiconductor layer or a P-type semiconductor layer may be formed on the second conductive semiconductor layer 130. Accordingly, at least one selected from the group consisting of an N-P junction, a P-N junction, an N-P-N junction, and a P-N-P junction structure may be formed in the light emitting structure 135.

Figure 5:
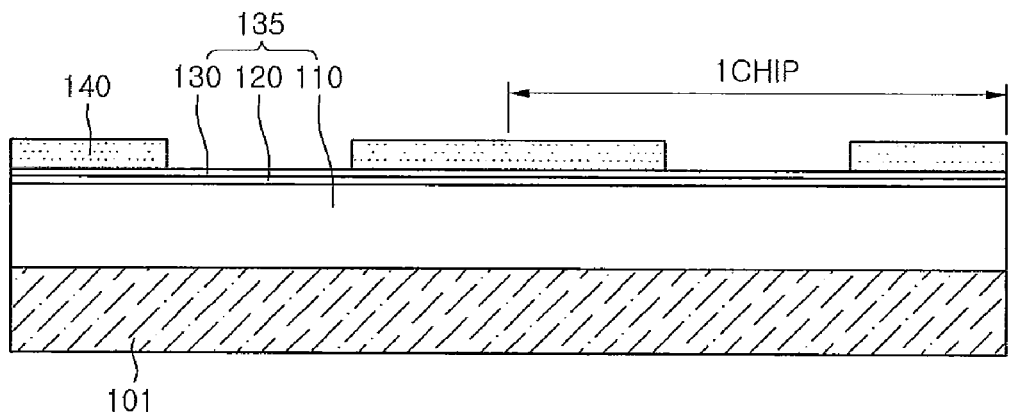

Referring to FIG. 5, a mask pattern is used on a chip boundary region on the second conductive semiconductor layer 130 to form a first insulating layer 140. The first insulating layer 140 is formed along the outer circumference of the top of the second conductive semiconductor layer 130 of an individual chip, and the shape may be formed in a continuous pattern with a belt shape, a loop shape, and a frame shape (eg: closed loop shape). In this case, the inner region of the second conductive semiconductor layer 130 is exposed.

The first insulating layer 140 may be formed of at least one selected from transparent insulating materials with a predetermined dielectric constant, for example, the group consisting of $SiO_2$, $SiO_x$, $SiO_xN_y$, and $Si_3N_4$, but is not limited thereto.

The first insulating layer 140 is formed of a material which is transmitted by laser light and has little debris generated by laser light and may improve adhesive force with the second conductive semiconductor layer 130. The first insulating layer 140 may be formed with a width or thickness of 2 μm or less, but is not limited thereto.

Figure 6:
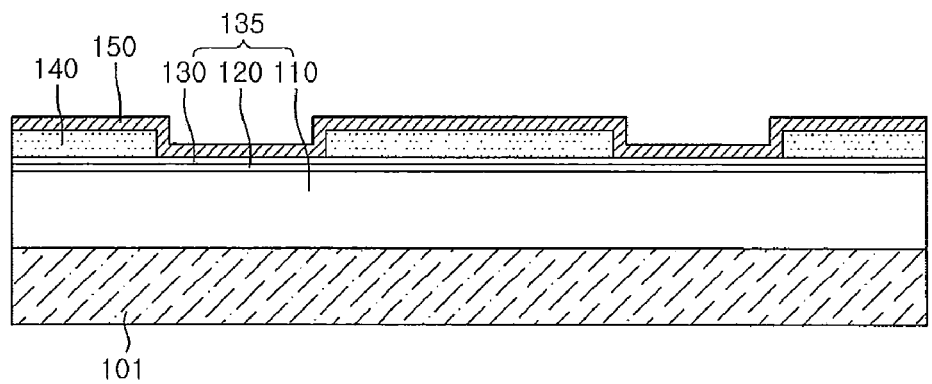

Referring to FIG. 6, a second electrode layer 150 is formed on the second conductive semiconductor layer 130 and the first insulating layer 140. The second electrode layer 150 may comprise at least one of an ohmic contact layer, a reflective layer, and an adhesive layer. The ohmic contact layer may be formed in the form of a layer or a plurality of patterns. The ohmic contact layer may be comprised at least one of a metal material and an oxide material. The ohmic contact layer may comprise at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh and Pd. The ohmic contact layer may have a thickness of about 10 Å to about 1 μm. However, the embodiment is not limited thereto. The reflective layer may be formed at least one of layers and formed of at least one of Ag, Ni, Al, Rh, Pd, Ir, Ru, Mg, Zn, Pt, Au and Hf, and materials consisting of the selective combination of these elements. The adhesive layer ma be formed at least one of layers and formed of at least one of Ti, Au, Sn, Ni, Cr, Ga, In, Bi, Cu, Ag, and Ta, and materials consisting of the selective combination of these elements. The second electrode layer 150 may be used as a seed layer for a plating process. The seed layer may be formed at least one of Ti, Cr, Ta, Cr/Au, Cr/Cu, Ti/Au, Ta/Cu, and Ta/Ti/Cu.

Figure 7:
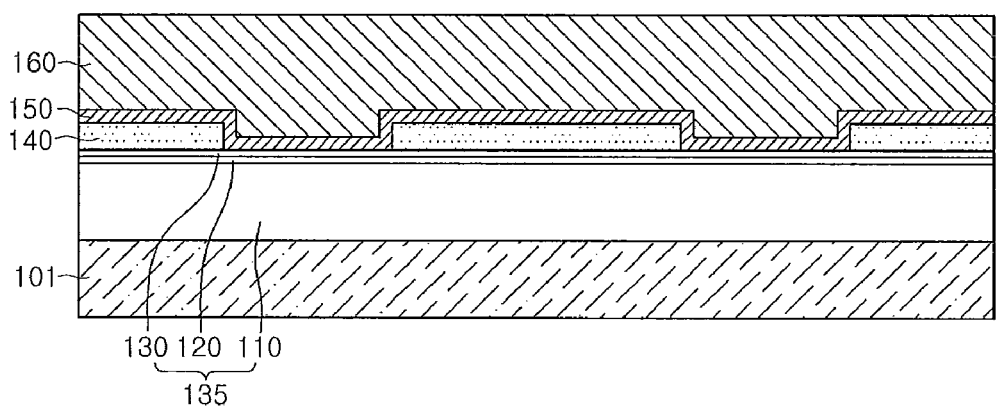

Referring to FIG. 7, a conductive supporting member 160 may be formed on the second conductive layer 150, the conductive supporting member 160 may function as a base substrate, and its material may include copper (Cu), gold (Au), nickel (Ni), molybdenum (Mo), copper-tungsten (Cu—W), and carrier wafer such as Si, Ge, GaAs, ZnO, and SiC, SiGe, and GaN. The conductive supporting member 160 may be formed by an electroplating technique or in the form of a sheet, but is not limited thereto. The conductive supporting member 160 may be formed with a thickness of about 30 μm to about 150 μm, but is not limited thereto.

Figure 8:
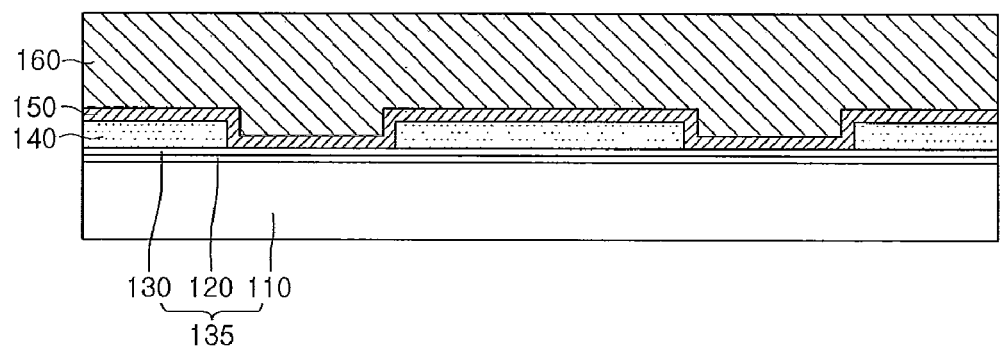

Referring to FIGS. 7 and 8, the conductive supporting member 160 is disposed on the base to remove the substrate 101. The substrate 101 is removed through a physical and/or chemical method.

The physical removal method separates the substrate 101 by irradiating a laser of a predetermined wavelength on the substrate 101 (Laser Lift Off: LLO). In a case where another semiconductor layer (eg: buffer layer) is formed between the substrate 101 and the first conductive semiconductor layer 110, the substrate 101 may be separated by removing the buffer layer through a chemical removal method using a wet etchant. The substrate removal method is not limited to the chemical removal method.

A polishing process may be performed by an inductively coupled plasma/reactive ion etching (ICP/RIE) method on the surface of the first conductive semiconductor layer 110 with the substrate 101 removed.

Figure 9:
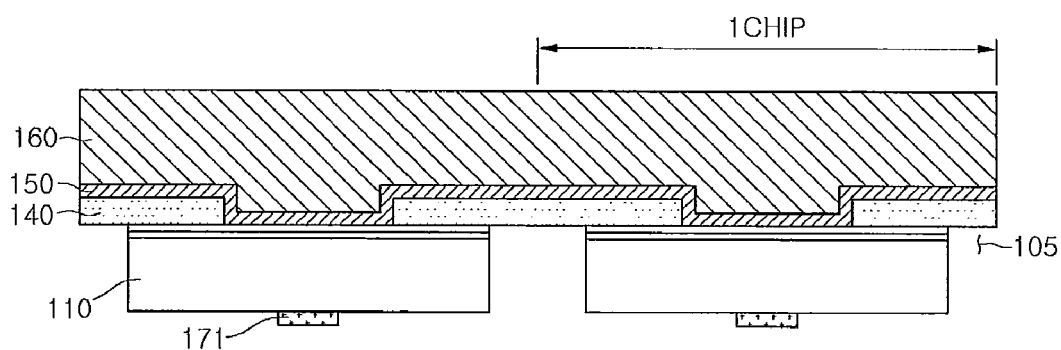

Referring to FIG. 9, isolation etching is performed on the chip-to-chip boundary region (ie, channel region) to separate the region into chip units. Then, the outer circumference 105 of the light emitting structure 135 is etched to expose the first insulating layer 140. In this case, outer side of the first insulating layer 140 is exposed to the outer circumference 105 of the light emitting structure 135, and the outer circumference of the first insulating layer 140 may separate the second electrode layer 150 from the side wall of the light emitting structure 135. The light emitting structure 135 has an effect of being inwardly shifted from the outer wall of the chip.

A first electrode 171 is formed under the first conductive semiconductor layer 110. The first electrode 171 may be formed in a predetermined shape and a predetermined pattern, but is not limited thereto.

Herein, a process of forming the first electrode 171 may be performed before or after the isolation etching or after the chip separation, but is not limited thereto.

Figure 10:
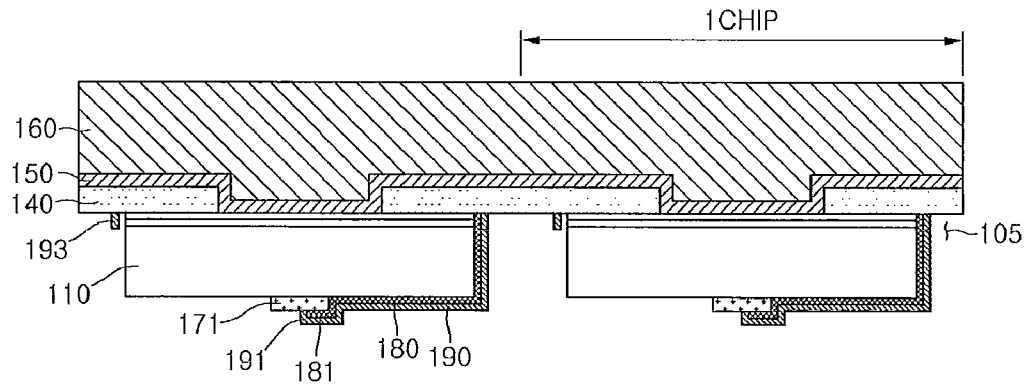

Referring to FIGS. 9 and 10, a second insulating layer 180 is formed on a predetermined region of the light emitting structure 135 using a mask pattern. The second insulating layer 180 is formed with a predetermined width extending from the first electrode 171 to the position of the first insulating layer 140 to cover the bottom of the first conductive semiconductor layer 110 and some portions of the side wall of the semiconductor layer 110, 120, and 130.

Herein, an end 181 of the second insulating layer 180 may be extended into the bottom of the first electrode 171.

The second insulating layer 180 may be formed of one selected from the group consisting of $SiO_2$, $SiO_x$, $SiO_xN_y$, and $si_3N_4$, or formed of a material identical to the first insulating layer 140 or another material.

A metal layer 190 is formed under the second insulating layer 180 and the first insulating layer 140, and the metal layer 190 includes a connection pattern 191 and a loop pattern 193. The connection pattern 191 of the metal-layer 190 is formed under (ie, at the outer side of) the second insulating layer 180, and is electrically connected to the first electrode 171.

The loop pattern 193 of the metal layer 190 is connected to the other end of the connection pattern 191, is disposed along the bottom circumference of the first insulating layer 140, and is separated from the outer wall of the light emitting structure 135. The loop pattern 193 may be formed in an open loop shape or a closed loop shape along the bottom circumference of the first insulating layer 140.

The metal layer 190 may be formed in a mono- or multi-layer of at least one selected from the group consisting of Ti, In, Ta, Pd, Co, Ni, Si, Ge, Ag, Au, and an alloy thereof.

The connection pattern 191 of the metal layer 190 is electrically connected to the first electric 171, and the loop pattern 193 is disposed to correspond to the second electrode 150.

The loop pattern 193 of the metal layer 190 may be formed in a pattern shape with a predetermined width under the first insulating layer 140, that is, may be formed in a structure as in FIG. 2. Then, the first insulating layer 140 is disposed between the loop pattern 193 of the metal layer 190 and the second electrode 150 to function as a capacitor. The capacitor is formed in a parallel structure with respect to the light emitting structure 135 to be charged or discharged by an abnormal power source (eg: ESD) applied to the light emitting structure 135. Accordingly, the light emitting structure 135 may be protected from the abnormal power source.

Figure 11:
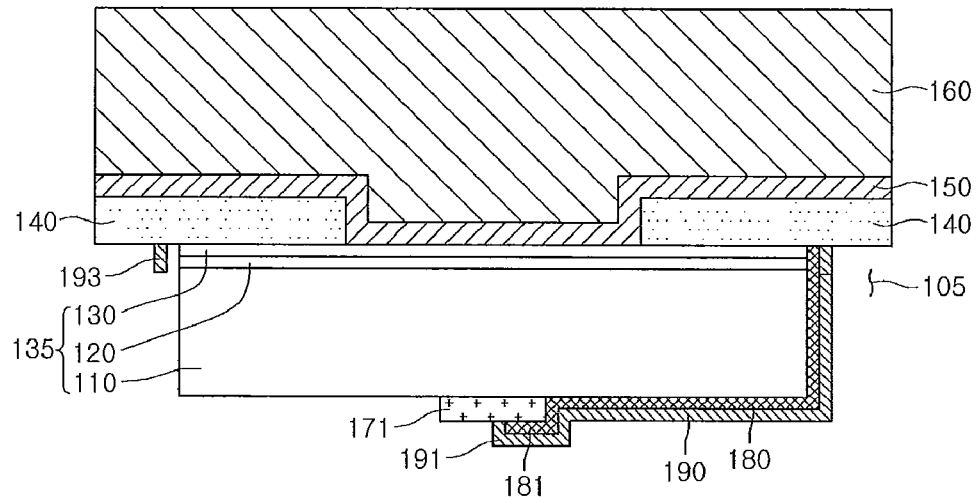

Referring to FIGS. 10 and 11, the semiconductor light emitting device is separated into chip units based on the boundary of the chips. Then, laser may be used for a chip separation method. The chip may provide a vertical semiconductor light emitting device with a capacitor.

Figure 12:
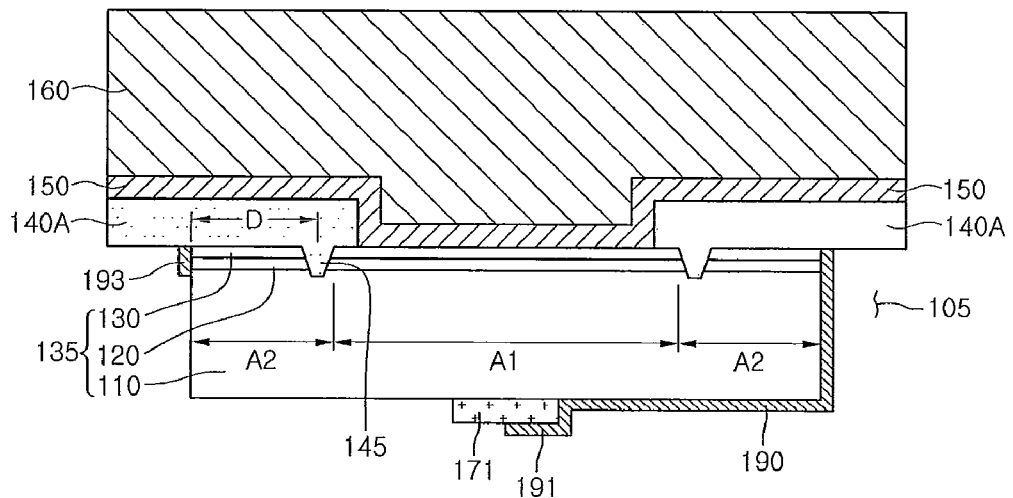
FIG. 12 is a side-sectional view of a semiconductor light emitting device according to a second embodiment.
Figure 13:
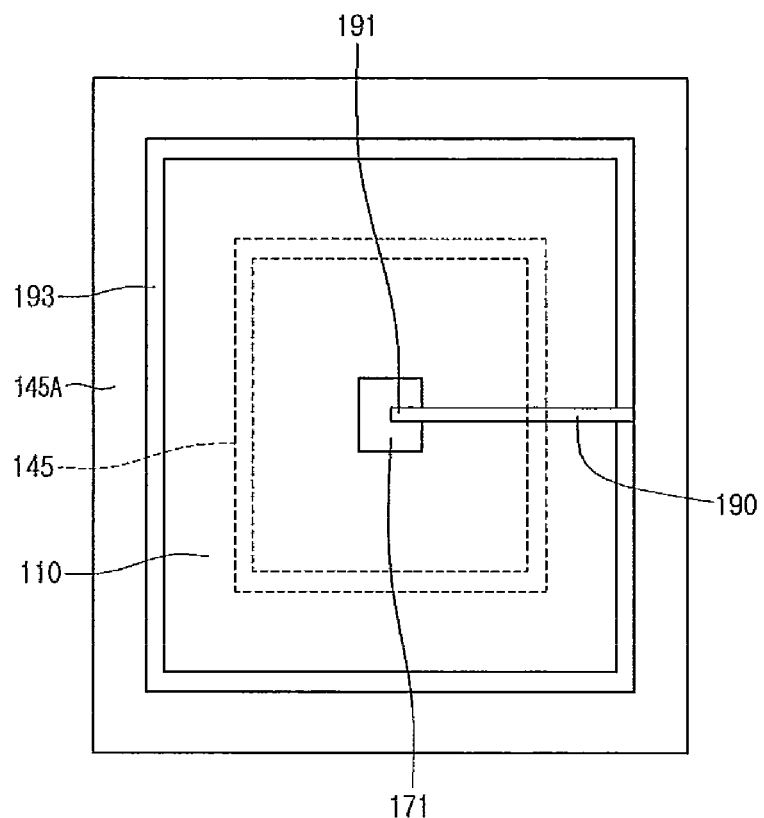
FIG. 13 is a bottom view of FIG. 11.

FIG. 12 is a side-sectional view of a semiconductor light emitting device according to a second embodiment, and FIG. 13 is a bottom view of FIG. 11. In description of the second embodiment, a repeated description about the portion identical to the first embodiment will be omitted with reference to the first embodiment.

Referring to FIGS. 12 and 13, a semiconductor light emitting device 100A includes a light emitting structure 135, a insulating layer 140A with an protrusion 145, a second electrode layer 150, a conductive supporting member 160, and a metal layer 190.

The insulating layer 140A may be formed in a continuous pattern (eg: closed loop shape) with a belt shape, a loop shape, and a frame shape on the bottom circumference of the second conductive semiconductor layer 130. The insulating layer 140A may include at least one selected from translucent insulating layers, for example, the group consisting of $SiO_2$, $SiO_x$, $SiO_xN_y$, $Si_3N_4$, $Al_2O_3$, and $TiO_2$ by using a mask pattern.

A second conductive layer 150 and the conductive supporting member 160 are formed on the insulating layer 140A and the second conductive semiconductor layer 130.

A protrusion 145 is formed under the inner side of the insulating layer 140. The protrusion 145 may be formed with a depth at which the first conductive semiconductor layer 110 is exposed.

The protrusion 145 of the insulating layer 140 may be formed in a continuously closed loop shape such as a belt shape or a loop shape, may be formed within a distance of about 1 μm to about 5 μm (D1) from the outer wall of the semiconductor layer 110, 120, and 130, and the distance range may be varied according to the size of the chip.

Herein, the cross-sectional shape of the protrusion 145 may be formed in a domed shape, a semi-elliptical shape, a horn shape, a truncated-horn shape, and a polygon shape and the shape may be modified.

The protrusion 145 of the insulating layer 140A may separate the light emitting structure 135 into an inner active region A1 and an outer inactive region A2. The semiconductor layer 110, 120, and 130 in the active region A1 is normally operated, and the semiconductor layer in the inactive region A2 is not normally operated.

A first conductive semiconductor layer 110 in the inactive region A2 may be used partially in current path.

A second insulating layer 180 in FIG. 1 may not be formed under the connection pattern 191 of the metal layer 190. Accordingly, a process of forming the second insulating layer may be removed.

A short problem between the connection pattern 191 of the metal layer 190 and the semiconductor layer 110, 120, and 130 of the light emitting structure 135 may be solved by the protrusion 145 of the insulating layer 140A.

In addition, the loop pattern 193 of the metal layer 190 may not be separated from the outer side of the light emitting structure 135.

Even if the outer side of the light emitting structure 135 is shorted, the active region is normally operated because the protrusion 145 of the insulating layer 140A inactivates the outer side of the light emitting structure 135.

The protrusion 145 of the active layer 140A may prevent moisture from being penetrated into the outer side of the chip. Because the protrusion 145 of the insulating layer 140A may be formed in a single or a double concave-convex structure, it may reinforce adhesive force with the light emitting structure 135.

Figure 14:
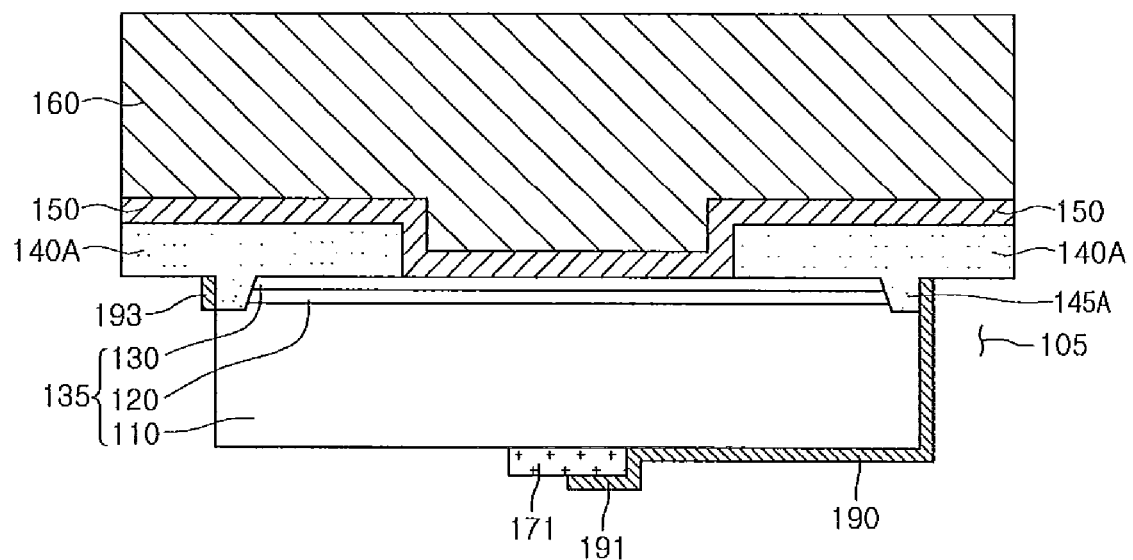
FIG. 14 is a side-sectional view of a semiconductor light emitting device according to a third embodiment.

FIG. 14 is a side-sectional view of a semiconductor light emitting device according to a third embodiment. In description of the third embodiment, a repeated description about the portion identical to the second embodiment will be omitted with reference to the second embodiment.

Referring to FIG. 14, a semiconductor light emitting device 100B includes a light emitting structure 135, a insulating layer 140A with an protrusion 145A, a second electrode layer 150, a conductive supporting member 160, and a metal layer 190.

The insulating layer 140A may be formed in a continuous pattern (eg: closed loop shape) with a belt shape, a loop shape, and a frame shape on the bottom circumference of the second conductive semiconductor layer 130. The insulating layer 140A may include at least one selected from translucent insulating layers, for example, the group consisting of $SiO_2$, $SiO_x$, $SiO_xN_y$, $Si_3N_4$, $Al_2O_3$, and $TiO_2$ by using a mask pattern.

A second conductive layer 150 and the conductive supporting member 160 are formed on the insulating layer 140A and the second conductive semiconductor layer 130.

A protrusion 145A is formed under the inner side of the insulating layer 140. The protrusion 145A may be formed with a depth at which the first conductive semiconductor layer 110 is exposed.

The protrusion 145A of the insulating layer 140 may be formed in a continuously closed loop shape such as a belt shape or a loop shape, may be formed to the outer wall of the semiconductor layer 110, 120, and 130.

Herein, the cross-sectional shape of the protrusion 145A may be formed in a polygon shape, a semi-elliptical shape, a horn shape, a truncated-horn shape, and a domed shape and the shape may be modified.

An outer wall of the light emitting structure 135 is electrically opened by the protrusion 145A of the insulating layer 140A. Accordingly, the second insulating layer is not formed on the light emitting structure 135.

Herein, the protrusion 145A of the insulating layer 140A may be formed on the circumference of the region, on which a loop pattern 193 of the metal layer 190 is disposed, to inactivate the region. In this case, the area of the active layer 120 may be increased with respect to the active layer of the second embodiment.

Figure 15:
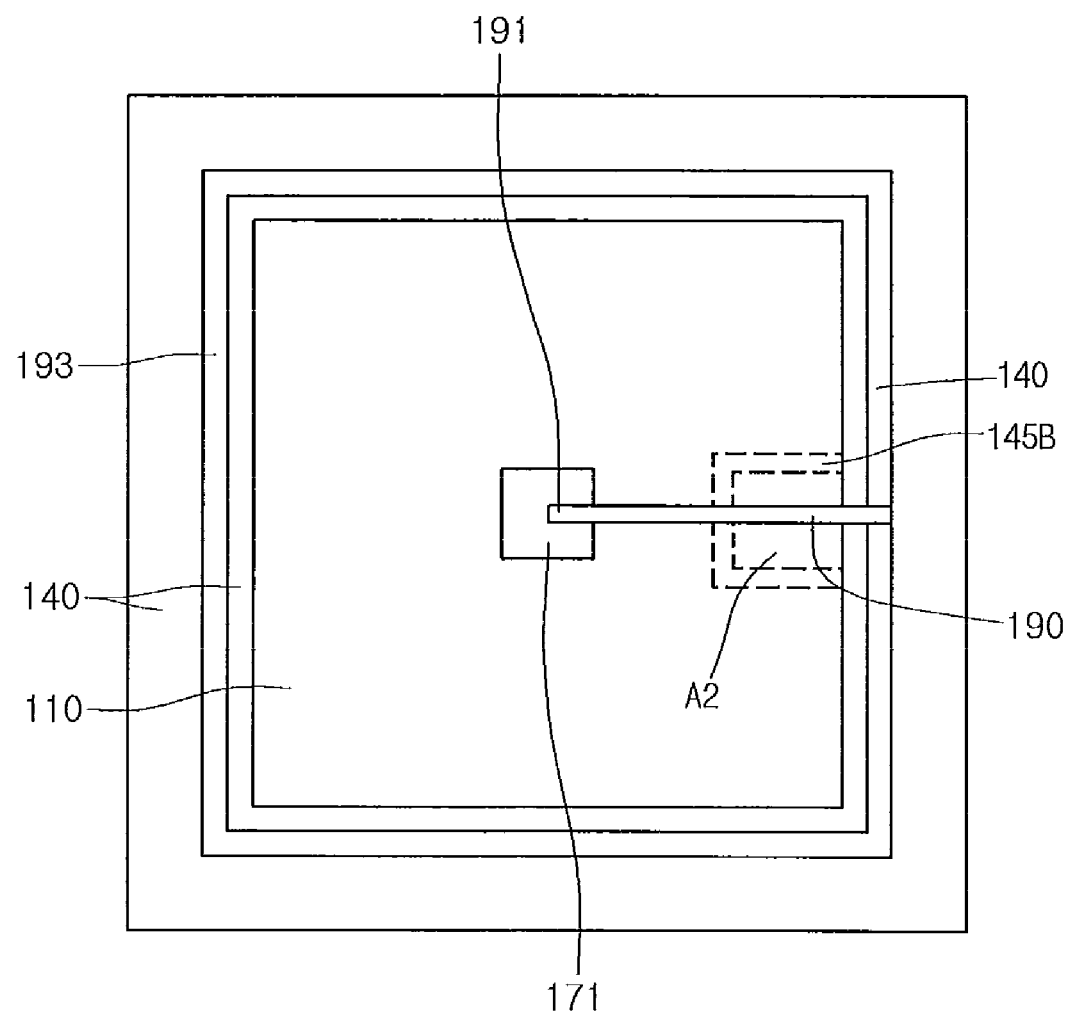
FIG. 15 a bottom view of a semiconductor light emitting device according to a fourth embodiment.

FIG. 15 a bottom view of a semiconductor light emitting device according to a fourth embodiment. In description of the fourth embodiment, a repeated description about the portion identical to the embodiments will be omitted with reference to the embodiments.

Referring to FIG. 15, a semiconductor light emitting device an insulating layer 140 with a protrusion 145B, a second electrode layer 150, a conductive supporting member 160, and a metal layer 190.

The insulating layer 140 may be formed in a continuous pattern (eg: closed loop shape) with a belt shape, a loop shape, and a frame shape on the bottom circumference of the second conductive semiconductor layer 130.

A protrusion 145B is formed under the inner side of the insulating layer 140. The protrusion 145B of the insulating layer may be formed with a depth at which the first conductive semiconductor layer 110 is exposed and contacted to the first conductive semiconductor 110.

The protrusion 145A of the insulating layer 140 may be formed in a continuously closed loop shape such as a belt shape or a loop shape, may be formed to a portion area of the semiconductor layer 110, 120, and 130.

The opened portion area of the light emitting structure 135 is electrically opened by the protrusion 145B of the insulating layer 140. Accordingly, the second insulating layer is not formed on the light emitting structure 135.

Herein, the protrusion 145B of the insulating layer 140 may be formed on the circumference of the opened portion area, on which a connection pattern 191 of the metal layer 190 is disposed, to inactive region A1. In this case, the area of the active layer 120 may be increased.

The metal layer 190 includes a connection pattern 191 and a loop pattern 193. The connection pattern 191 is electrically connected to the first electrode 171, and the other end is electrically connected to the loop pattern 193. The connection pattern 191 is disposed to the opened portion area or the inactive region A1.

The loop pattern 193 is electrically connected to the connection pattern 191 of the metal layer 190, and disposed along the bottom circumference of the first insulating layer 140. Accordingly, the loop pattern 193 of the metal layer 190 and the second electrode layer face each other on both sides of the first insulating layer 140.

A first current path passing through the light emitting structure 135 and a second current path corresponding to the first insulating layer 140 may be disposed in parallel.

A method for manufacturing a semiconductor light emitting device, the method comprising: forming a plurality of compound semiconductor layers to form a light emitting structure; forming a first insulating layer on the top circumference of the light emitting structure; forming a second electrode layer on the first insulating layer and the light emitting structure; forming a first electrode under the light emitting structure; and forming a metal layer comprising a loop pattern on the bottom circumference of the first insulating layer and a connection pattern connected to the first electrode.

Although the description of the first and second embodiments were centered on each embodiment, the description may be performed by applying the first embodiment in combination with the second embodiment, and the second embodiment in combination with the first embodiment, but is not limited to characteristics of each embodiment.

Embodiments can provide a vertical semiconductor light emitting device including a built-in capacitor.

Embodiments can provide a vertical semiconductor light emitting device robust against ESD.

Embodiments can provide a light emitting device robust against moisture by opening the outer side of the light emitting structure.

Embodiments can improve adhesive force between a semiconductor layer and another layer.

Embodiments can prevent interlayer short defects of a plurality of compound semiconductor layers.

Embodiments can improve the reliability of the vertical semiconductor light emitting device.

Embodiments can provide a semiconductor light emitting device like LED.

Embodiments can improve the electrical reliability of the semiconductor light emitting device.

Embodiments can improve the light efficiency of the vertical semiconductor light emitting device.

Embodiments can apply a light source including a packaged semiconductor light emitting device to an illumination field, an indication field, and a display field.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
an electrode layer;
a light emitting structure on the electrode layer;
a first electrode on the light emitting structure;
a first insulation layer disposed between the electrode layer and the light emitting structure, the first insulation layer being disposed on the periphery thereof; and
a metal layer including one portion contacted with the first electrode and another portion disposed on the first insulation layer facing to the electrode layer.

2. The semiconductor light emitting device of claim 1, comprising a second insulation layer disposed between the light emitting structure and the metal layer.

3. The semiconductor light emitting device of claim 1, wherein the first insulation layer includes a region isolation projection electrically separates the inside region of the light emitting structure from the outside region of the light emitting structure.

4. The semiconductor light emitting device of claim 1, wherein the metal layer, the electrode layer and the first insulation layer between thereof are operated as a capacitor.

5. The semiconductor light emitting device of claim 1, wherein the light emitting structure has a composition formula of $In_xAl_yGa_{1-x-y}N$ ($0 \leq x \leq 1$, $0 \leq y \leq 1$, $0 \leq x+y \leq 1$), and includes a second conductive type semiconductor layer disposed on the first insulation layer and the electrode layer; an active layer disposed on the second conductive type semiconductor layer; and a first conductive type semiconductor layer disposed between the active layer and the first electrode.

6. The semiconductor light emitting device of claim 5, wherein the light emitting structure includes a third conductive type semiconductor layer disposed between the electrode layer and the second conductive type semiconductor layer.

7. The semiconductor light emitting device as claimed in claim 3, wherein the region isolation projection of the first insulation layer is formed in a closed-loop shape within 5 μm from the outer wall of the light emitting structure.

8. The semiconductor light emitting device of claim 1, comprising a conductive support member disposed under the electrode layer.

9. The semiconductor light emitting device of claim 1, wherein the first insulation layer includes a material of an oxide layer series.

10. The semiconductor light emitting device of claim 3, wherein the metal layer, the electrode layer and the first insulation layer between thereof are operated as a capacitor.

11. The semiconductor light emitting device of claim 3, wherein the light emitting structure has a composition formula of $In_xAl_yGa_{1-x-y}N$ ($0 \leq x \leq 1$, $0 \leq y \leq 1$, $0 \leq x+y \leq 1$), and includes a second conductive type semiconductor layer disposed on the first insulation layer and the electrode layer; an active layer disposed on the second conductive type semiconductor layer; and a first conductive type semiconductor layer disposed between the active layer and the first electrode.

12. The semiconductor light emitting device of claim 1, wherein the light emitting structure includes a third conductive type semiconductor layer disposed between the electrode layer and the second conductive type semiconductor layer.

13. The semiconductor light emitting device of claim 3, comprising a conductive support member disposed under the electrode layer.

14. The semiconductor light emitting device of claim 3, wherein the first insulation layer includes a material of an oxide layer series.

* * * * *